United States Patent [19]

Carow

[11] 4,259,641
[45] Mar. 31, 1981

[54] LINEARIZED DETECTOR/RECTIFIER CIRCUIT

[76] Inventor: Donald W. Carow, 201 W. California Ave., Apt. 316, Sunnyvale, Calif. 94086

[21] Appl. No.: 968,309

[22] Filed: Dec. 11, 1978

[51] Int. Cl.³ .......................... H03D 1/10; H02M 7/06
[52] U.S. Cl. .................................... 329/101; 307/350; 329/168; 329/192; 329/205 R; 363/126; 363/127
[58] Field of Search ................................ 329/101–103, 329/168, 192, 203, 204, 205 R; 307/350; 363/125, 126, 127

[56] References Cited

U.S. PATENT DOCUMENTS

| | | | |
|---|---|---|---|
| 3,070,750 | 12/1962 | Farber | 329/101 X |
| 3,411,066 | 11/1968 | Bravenec | 363/126 |
| 3,852,676 | 12/1974 | Hongu et al. | 329/103 |

*Primary Examiner*—Siegfried H. Grimm
*Attorney, Agent, or Firm*—Flehr, Hohbach, Test, Albritton & Herbert

[57] ABSTRACT

Circuit for use in the rectification and detection of alternating electrical signals. The circuit employs a feedback amplifier in combination with a non-linear rectifier element to provide an output signal which has a linear relationship to the input signal notwithstanding the non-linear characteristic of the rectifier element. In some embodiments, the circuit is also capable of power gain and/or frequency selectivity.

9 Claims, 6 Drawing Figures

LINEARIZED DETECTOR/RECTIFIER CIRCUIT

This invention pertains generally to rectifiers and detectors and more particularly to a circuit which is useful in the precision rectification or detection of alternating electrical signals.

Rectifier circuits for converting alternating current (AC) signals to direct current (DC) are widely employed in meters and other measuring instruments which require DC input signals. Detector circuits are used for demodulating amplitude modulated signals in radio receivers, demodulating video signals in television receivers and as mixers in superheterodyne receivers.

Rectifier or detector circuits generally employ one or more rectifying elements which conduct current substantially in one direction only. Such elements are generally non-linear devices in that the output voltage or current is a non-linear function of the input voltage. With such devices, linear operation within a limited range can sometimes be obtained by careful selection of factors such as the operating point, signal level, driving source resistance and load resistance. There have also been attempts to provide linear operating characteristics through the use of current driving rather than voltage driving, and one such attempt is described in U.S. Pat. No. 3,852,676, dated Dec. 3, 1974.

It is in general an object of the invention to provide a new and improved rectifier/detector circuit which is useful in the precision rectification or detection of alternating electrical signals.

Another object of the invention is to provide a rectifier/detector circuit of the above character which has a substantially linear operating characteristic.

Another object of the invention is to provide a rectifier/detector circuit which in some embodiments is capable of power gain and/or frequency selectivity.

The foregoing and other objects are obtained in a rectifier/detector circuit having a non-linear rectifier for developing an output voltage which is a non-linear function of the input voltage applied thereto, a node point connected to the input of the rectifier, means for delivering a signal current to the node point, and amplifier means responsive to the node point voltage with a feedback connection between the output of the amplifier and the node point for adjusting the node point voltage to maintain a linear relationship between the signal current and the output voltage of the rectifier.

Figure 1:
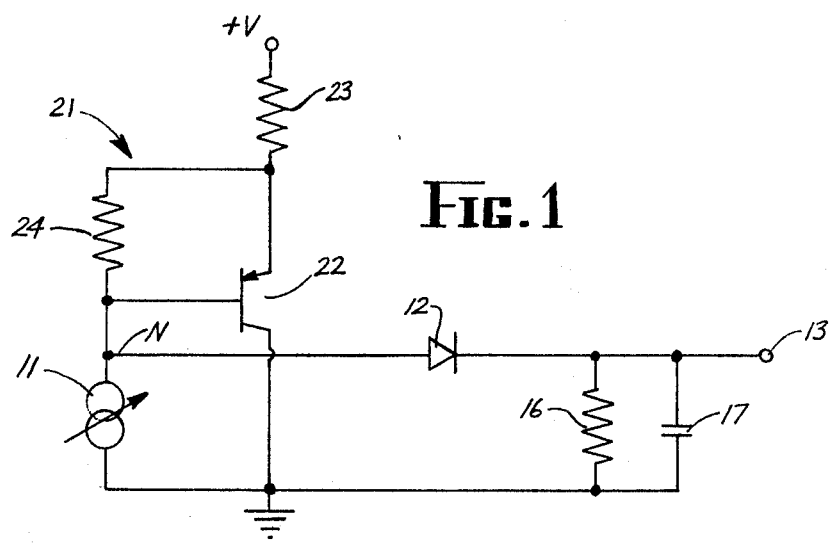
FIGS. 1–4 are circuit diagrams of certain embodiments of a rectifier/detector circuit according to the invention.

The rectifier/detector circuit includes means for delivering a signal current to a node point N. As illustrated in FIG. 1, this means comprises a variable current source connected between the node point and ground. The current source is of conventional design and the proper polarity for drawing a constant DC current and an alternating signal current from the node point, the signal current being superimposed on the constant current.

The node point is connected to the input of a non-linear rectifier 12 which comprises a single diode in the embodiment of FIG. 1. However, it will be understood that other rectifying elements can be employed and that the rectifier can include a plurality of individual rectifying devices and associated circuit elements. The output of the rectifier is connected to an output terminal 13, and a load resistor 16 and a bypass capacitor 17 are connected between the output terminal and ground. These elements are selected to have values such that the reactance of the capacitor is high compared to the load resistance at the frequency of the modulating signal and low compared to the load resistance at higher frequencies.

Amplifier means 21 is connected to node point N for adjusting the level of the node point voltage to maintain a linear relationship between the input signal current and the output voltage of the rectifier. In the embodiment of FIG. 1, this amplifier comprises a PNP transistor 22 connected as an emitter follower with its base connected to the node point, its collector connected to ground, and its emitter connected to a positive voltage source through a resistor 23. A feedback resistor 24 is connected between the emitter and base of the transistor and provides a feedback connection between the output of the amplifier and the node point.

Operation and use of the embodiment of FIG. 1 is as follows. The current delivered to the rectifier from the node point is the difference between the current supplied to the node point by amplifier 21 and the current delivered by source 11, the latter consisting of a signal current superimposed on a constant DC current. The feedback amplifier senses the voltage at the node point and adjusts the current through the feedback resistor accordingly. Thus, the node point voltage is adjusted by the feedback circuit to whatever value is required to drive current from the node point through the rectifier and load to maintain a substantially linear relationship between the input signal and the output of the rectifier.

Figure 2:
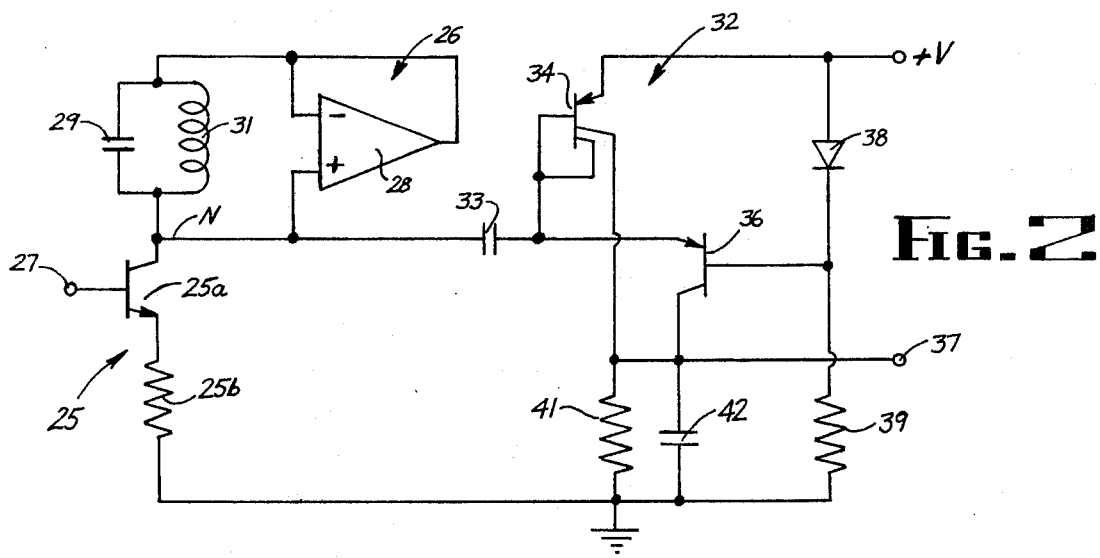

The embodiment of FIG. 2 is similar to that of FIG. 1 in that it includes a current source 25 for delivering a signal current to the node point N and a feedback amplifier 26 connected to the node point. The current source comprises a transistor 25a having its base connected to an input terminal 27, its emitter connected to ground through a resistor 25b, and its collector connected to the node point N. The transistor delivers a signal current to the node point which has a linear relationship to a voltage or other input signal applied to terminal 27. The amplifier consists of an operational amplifier 28 having its non-inverting input connected to the node point and its output connected to its inverting input. Feedback to the node point is provided by a tuned circuit consisting of a capacitor 29 and an inductor 31 connected in parallel between the output of the amplifier and the node point. If desired, other types of frequency selective elements such as crystals, ceramics and tuned lines can be utilized in place of this and other tuned circuits in the disclosed embodiments.

The node point is connected to the input of a rectifier 32 by a coupling capacitor 33 which prevents DC leakages from masking the detected output signal.

This rectifier is a full-wave rectifier utilizing transistors 34,36. Transistor 34 is a dual collector transistor having its base connected to the output side of capacitor 33, its first collector connected to an output terminal 37, its second collector connected back to its base, and its emitter connected to a positive voltage source. Transistor 36 is a PNP transistor having its emitter connected to the coupling capacitor and its collector connected to the output terminal. Biasing for this transistor is provided by a voltage divider consisting of a diode 38 and a resistor 39 connected in series between the positive voltage source and ground, with the junction of the diode and resistor connected to the base of the transistor. As in the embodiment of FIG. 1, a load resistor 41 and a bypass capacitor 42 are connected between the output terminal and ground.

Operation and use of the embodiment of FIG. 2 is generally that described above in connection with FIG. 1. The current delivered to the rectifier is the difference between the current supplied to the node point by amplifier 26 and the current drawn from the node point by transistor 25a. The amplifier senses the voltage at the node point and adjusts this voltage to maintain the desired linear relationship between the rectifier output voltage and the signal current. The tuned circuit consisting of capacitor 29 and inductor 31 provides selectivity, and coupling capacitor 33 prevents DC leakages from masking the desired signal at the output of the rectifier.

When current is drawn from the rectifier toward node point N, transistor 34 conducts, and substantially equal currents flow in each of its two collectors. Thus, during this portion of the cycle, a current substantially equal to the source current is driven into load resistor 41 by transistor 34. During the portion of the cycle in which current is flowing from the node point to the rectifier, transistor 34 cuts off and transistor 36 conducts substantially all of the source current into the load resistor. In the absence of signal current, transistors 34 and 36 are both cut off.

Figure 3:
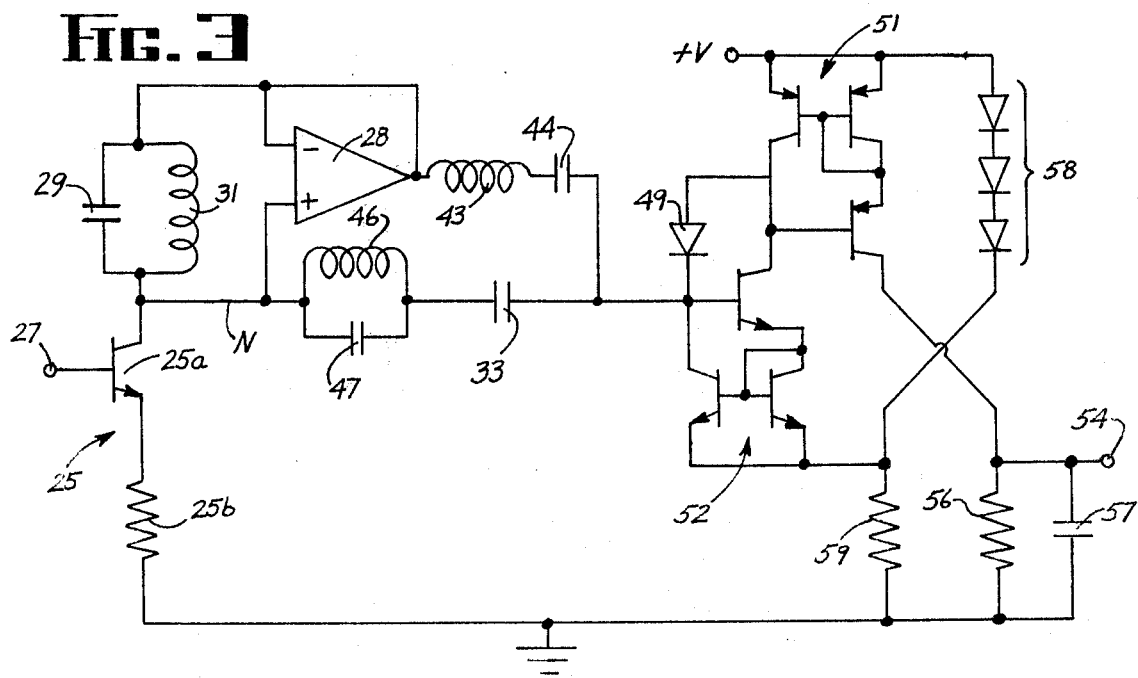

With an amplifier having sufficient gain and frequency response, current gain can be added by providing an additional path between the output of the amplifier and the input of the rectifier. In the embodiment of FIG. 3, the additional path is provided by a series tuned circuit consisting of an inductor 43 and a capacitor 44 connected between the output of operational amplifier 28 and the input of the rectifier. The current in this path is controlled by an impedance connected between the node point and the input of the rectifier, and in the embodiment illustrated the impedance comprises an inductor 46 and a capacitor 47 connected in parallel between the node point and coupling capacitor 33. The current flowing in the additional path will be $i \cdot (Z_b/Z_a)$, where i is the current in the path between the node point and the rectifier, $Z_a$ is the impedance of the additional path, and $Z_b$ is the impedance of the path between the node point and the rectifier. It will be understood that other types of frequency sensitive elements can be employed in place of the inductors and capacitors shown in FIG. 3, and that resistive elements can also be employed where frequency selectivity is not desired.

The rectifier of the embodiment of FIG. 3 utilizes a diode 49 with complementary current mirror circuits 51, 52 to provide full wave rectification. As illustrated, the current mirror circuits are of a type commonly known as "Wilson circuits", although other suitable circuits can be utilized. The output of current mirror 51 is connected to an output terminal 54, and a load resistor 56 and a bypass capacitor 57 are connected between the output terminal and ground. Biasing for the current mirrors is provided by diodes 58 and a resistor 59 connected in series between the positive voltage source and ground.

Figure 4:
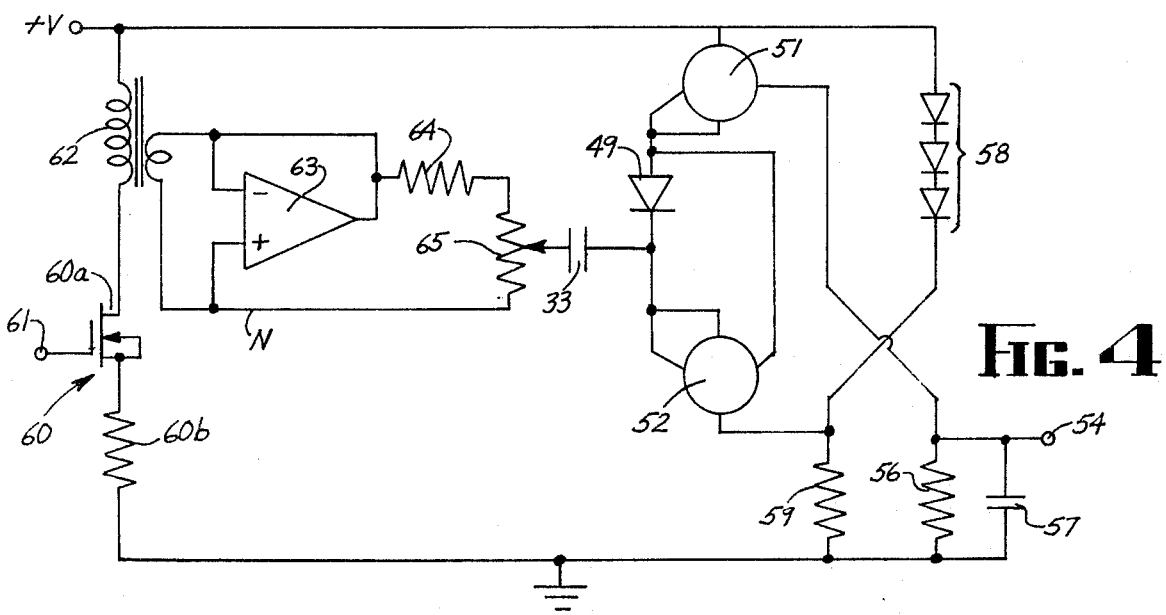

In the embodiment of FIG. 4, a current source 60 comprising a metal oxide semiconductor field effect transistor (MOSFET) 60a and a source resistor 60b is coupled to the node point and amplifier through a transformer 62, and the gate of the MOSFET is connected to an input terminal 61. The primary winding of the transformer is connected between the drain of the MOSFET and a positive voltage source, and the secondary winding is connected between the output of operational amplifier 63 and the node point. The node point is also connected to the noninverting input of the operational amplifier, and the output of this amplifier is connected to the inverting input. A fixed resistor 64 and a gain control potentiometer 65 are connected in series between the output of the amplifier and the node point, and the wiper of the potentiometer is connected to the input side of coupling capacitor 33. Resistor 64 serves as a current limiting resistor which prevents the potentiometer from being set to provide a gain which the amplifier cannot deliver. The rectifier portion of the circuit of FIG. 4 is similar to that of FIG. 3.

Transformer 62 is a power transformer having a primary-to-secondary turns ratio greater than 1. Since the signal current is multiplied by the turns ratio of the transformer, a significant current gain is possible.

Figure 5:
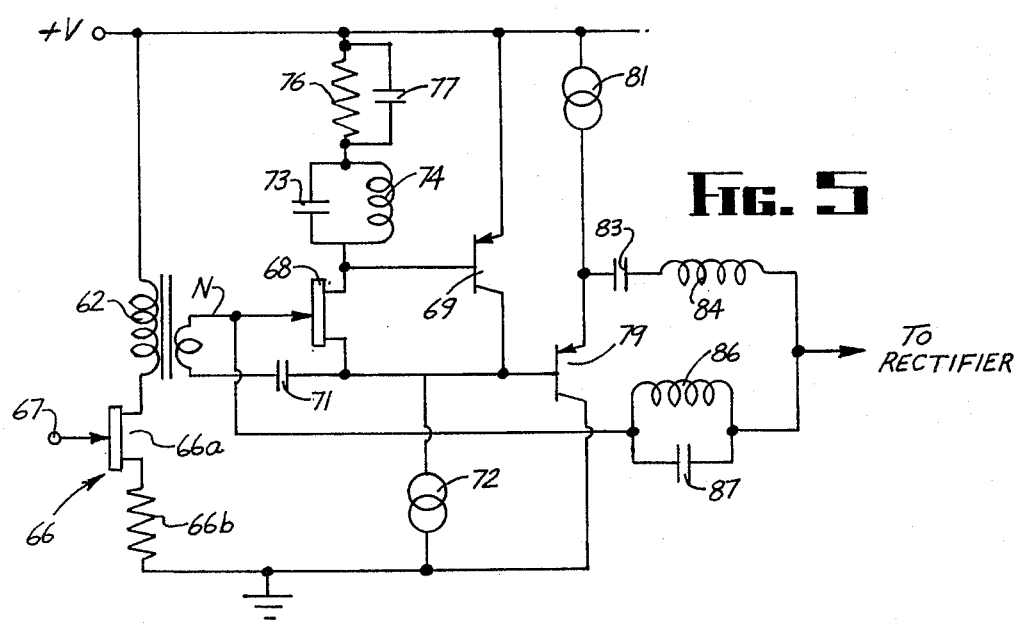
FIGS. 5–6 are circuit diagrams of the input stages of additional embodiments of a rectifier/detector circuit according to the invention.

The embodiment of FIG. 5 also uses a current source 66 coupled to the node point and amplifier through a transformer 62. This current source comprises a junction field effect transistor (JFET) 66a having a source resistor 66b, with the gate of the JFET being connected to an input terminal 67 and the drain connected to the primary winding of the transformer. In this embodiment, the amplifier includes a JFET 68 and a transistor 69. One end of the transformer secondary is connected to the gate of JFET 68, and the other end is connected to the source through a DC blocking capacitor 71. The drain of JFET 68 is connected to the base of transistor 69, the emitter of transistor 69 is connected to a positive voltage source, and the collector is connected to a current source 72. The source of JFET 68 is also connected to the current source 72. Frequency selectivity within the amplifier is provided by a tuned circuit in the drain circuit of JFET 68. The tuned circuit comprises a capacitor 73 and an inductor 74 having values chosen to provide a peak gain at the carrier frequency, with a roll-off in gain at frequencies of high phase shift to prevent oscillation. A resistor 76 is connected in series with the tuned circuit and controls the DC current flow through the JFET. A bypass capacitor 77 is connected across this resistor. The output of the amplifier is taken at the collector of transistor 69, and feedback from this point to the node point is provided by capacitor 71 and the secondary winding of the transformer.

The embodiment of FIG. 5 is similar to the embodiment of FIG. 3 in that an additional current path is provided between the output of the amplifier and the input of the rectifier. In the embodiment of FIG. 5, however, the additional path includes a transistor 79 which serves as a buffer to prevent excessive loading of the amplifier. The output of the amplifier is connected to the base of transistor 79 which operates as an emitter follower, with its collector connected to ground and its emitter connected to a current source 81. A capacitor 83 and an inductor 84 are connected in series between the emitter of transistor 79 and the input of the rectifier, and an inductor 86 and a capacitor 87 are connected in parallel between the node point and the input of the rectifier. These elements function in a manner similar to elements 43–47 to set the level of the additional current supplied to the rectifier.

With high frequencies and weak signals, some signal current may be lost from the node point due to the stray capacitance between the transformer core and the secondary winding. This loss can be substantially eliminated by driving the core with the signal current. This can be done by providing a connection between the core and the output of the amplifier, either directly or indirectly, for example, through a voltage follower.

Figure 6:
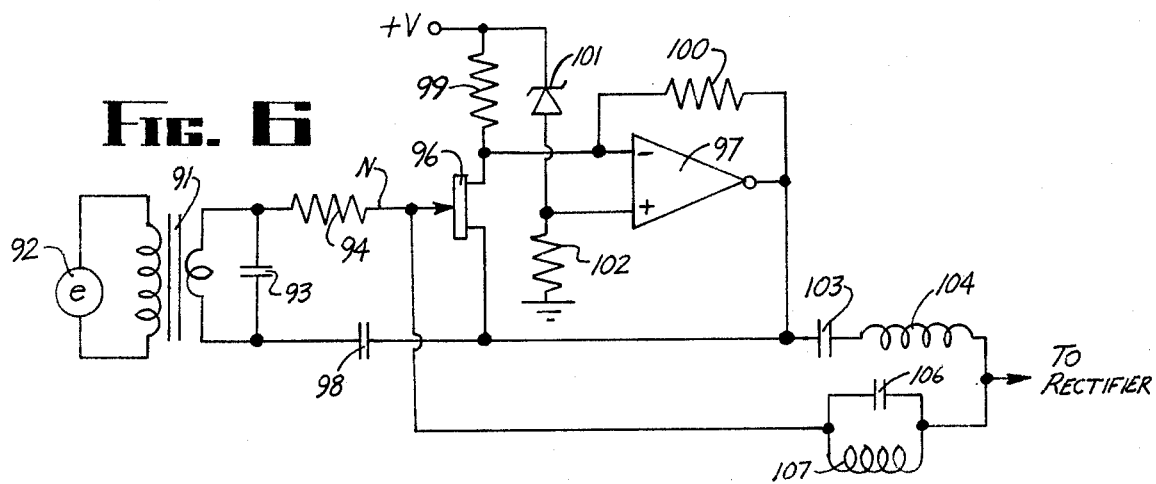

In the embodiment of FIG. 6, a transformer 91 is driven by a voltage source 92 which is connected across the primary winding of the transformer. A tuning capacitor 93 is connected across the secondary winding, and a signal current is developed in a resistor 94 which is connected in series with one end of the secondary. If desired, a series tuned circuit or other frequency selective impedance can be utilized in place of resistor 94.

In this embodiment, the amplifier comprises a JFET 96 and an operational amplifier 97. The node point at the side of resistor 94 opposite the secondary winding of the transformer is connected to the base of JFET 96, and the source of the JFET is connected to the other side of the secondary winding through a blocking capacitor 98. A resistor 99 is connected between the drain of the JFET and a positive voltage source, and the drain is also connected to the inverting input of amplifier 97. A gain setting resistor 100 is connected between the output and the inverting input of the operational amplifier, and the non-inverting input of this amplifier is connected to the junction of a Zener diode 101 and a resistor 102 connected in series between the positive voltage source and ground. The output of amplifier 97 is fed back to the node point through DC blocking capacitor 98, the transformer secondary and resistor 94.

An additional current path consisting of a capacitor 103 and an inductor 104 is provided between the output of the amplifier and the input of the rectifier, and as in the previous embodiments, the level of this current is controlled by a capacitor 106 and an inductor 107 connected in parallel between the node point and the input of the rectifier.

It is apparent from the foregoing that a new and improved rectifier/detector circuit has been provided. The circuit has a linear characteristic in that the output signal bears a linear relationship to the input signal notwithstanding the fact that the rectifying element itself is a non-linear device. The circuit can handle weak signals without loss of signal to forward bias rectifier junctions, and it can be used to demodulate signals with intelligence of any frequency. The circuit provides a power gain for good sensitivity and permits the use of tuned circuits or their equivalent for good selectivity.

While only certain presently preferred embodiments have been described in detail, as will be apparent to those familiar with the art, certain changes and modifications can be made without departing from the scope of the invention as defined by the following claims.

What is claimed is:

1. In a rectifier/detector circuit: a non-linear rectifier delivering an output voltage which is a non-linear function of the input voltage applied thereto, a node point connected to the input of the rectifier, means for delivering a signal current to the node point, and amplifier means responsive to the node point voltage with a feedback connection between the output of the amplifier means and the node point for adjusting the node point voltage to maintain a linear relationship between the signal current and the output voltage of the rectifier.

2. The rectifier/detector circuit of claim 1 wherein the means for delivering the signal current includes means responsive to an input signal for delivering to the node point a current having a substantially linear relationship to the input signal.

3. The rectifier/detector circuit of claim 1 wherein the feedback connection includes means for selectively passing signals at the frequency of the signal current.

4. The rectifier/detector circuit of claim 1 together with impedance means connecting the node point to the input of the rectifier.

5. The rectifier/detector circuit of claim 1 together with means for delivering an additional current from the output of the amplifier means to the input of the rectifier.

6. The rectifier/detector circuit of claim 5 wherein the means for delivering the additional current includes a frequency selective impedance connected between the output of the amplifier means and the input of the rectifier.

7. The rectifier/detector circuit of claim 1 wherein the amplifier means comprises a tuned amplifier.

8. The rectifier/detector circuit of any of claims 1–7 wherein the signal current is delivered to the node point through a current step-up transformer.

9. In a rectifier-detector circuit: a non-linear rectifier for delivering an output voltage which is a non-linear function of the input voltage applied thereto, a node point connected to the input of the rectifier, means including a voltage-driven transformer for delivering a signal current to the node point, and amplifier means responsive to the node point voltage with a feedback connection between the output of the amplifier means and the node point for adjusting the node point voltage to maintain a linear relationship between the signal current and the output voltage of the rectifier.

* * * * *